(12) United States Patent
Nishiura

(10) Patent No.: US 6,784,394 B2
(45) Date of Patent: Aug. 31, 2004

(54) BALL FORMATION METHOD AND BALL FORMING DEVICE USED IN A WIRE BONDING APPARATUS

(75) Inventor: Shinichi Nishiura, Fussa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/272,885

(22) Filed: Oct. 17, 2002

(65) Prior Publication Data

US 2003/0075586 A1 Apr. 24, 2003

(30) Foreign Application Priority Data

Oct. 18, 2001 (JP) .......................................... 2001-320577

(51) Int. Cl.⁷ ............................. B23K 9/00; B23K 9/06; B23K 31/02

(52) U.S. Cl. ............................... 219/56.22; 219/56.21; 219/130.4; 228/180.5; 228/4.5

(58) Field of Search ................................ 228/180.5, 4.5, 228/110.1, 1.1; 219/56.21, 56.22, 130.4

(56) References Cited

U.S. PATENT DOCUMENTS

| 3,260,890 A | * | 7/1966 | Normando et al. ........... 315/173 |
| 4,513,190 A | * | 4/1985 | Ellett et al. ............... 219/56.21 |
| 4,950,866 A | * | 8/1990 | Kojima et al. .......... 219/137 PS |
| 4,976,393 A | * | 12/1990 | Nakajima et al. ............ 228/111 |
| 5,773,780 A | * | 6/1998 | Eldridge et al. .......... 219/56.22 |
| 6,234,376 B1 | * | 5/2001 | Wicen ....................... 228/180.5 |

FOREIGN PATENT DOCUMENTS

JP          9-298215          11/1997          ........... H01L/21/60

* cited by examiner

*Primary Examiner*—Kiley Stoner
*Assistant Examiner*—Kevin P. Kerns
(74) *Attorney, Agent, or Firm*—Koda & Androlia

(57) ABSTRACT

A ball forming method and device used in a wire bonding apparatus in which a discharge is caused to occur by applying a high voltage between an electric torch and a tip end of a wire that extends out of a lower end of a capillary so as to form a ball at a tip end of the wire, and an insulating member is provided so as to cover the electric torch with a space between the vicinity of a discharge portion of the electric torch and the insulating member, a heater being further provided on the insulating member so as to heat such a space.

3 Claims, 1 Drawing Sheet

BALL FORMATION METHOD AND BALL FORMING DEVICE USED IN A WIRE BONDING APPARATUS

BACKGROUND OF THE INVENTION

1. Field of the Invention

The present invention relates to a ball formation method and ball forming device used in a wire bonding apparatus.

2. Prior Art

A wire bonding apparatus typically includes a step that causes a discharge to occur by way of applying a high voltage between an electric torch and a tip end of a wire that extends out of the lower end of a capillary, thus forming a ball at the tip end of the wire.

Japanese Patent Application Laid-Open (Kokai) No. 9-298215, for instance, discloses a ball forming device that performs a stable discharge by way of eliminating unstable elements during ball formation process in order to obtain a constant ball diameter. In this ball forming device, an electric torch is employed; and this electric torch is covered by a cover, that is made of a tubular insulating material, with a gap between the vicinity of the discharge portion of the electric torch and the insulating material. In other words, because of such a gap, there is no boundary between the electric torch and the cover; and as a result, the diameter of the formed balls can be constant.

The above-described prior art, however, merely eliminates the effects on the electric torch caused by the cover that covers the electric torch; and no alleviation of the effect of the atmosphere that surrounds the electric torch is taken into consideration. Though certain effects are recognized in this device, a constant formation of a small ball in particular is not sufficiently satisfied when it comes to ultra-fine-pitch bonding.

SUMMARY OF THE INVENTION

Accordingly, the object of the present invention is to provide a ball formation method and a ball forming device used in a wire bonding apparatus, in which the free electrons on the surface of an electric torch are activated, the atmosphere surrounding the electric torch is stabilized, and a stable electric discharge is provided so as to produce constant diameter balls at the end of a wire.

The above object is accomplished by a unique ball formation method of the present invention that is used in a wire bonding apparatus in which a discharge is caused to occur by applying a high voltage between an electric torch and a tip end of a wire that extends out of a lower end of a capillary so as to form a ball at a tip end of the wire; and in the present invention, the discharge is performed in a state in which a discharge portion of the electric torch is covered by an insulating member with a space formed between the discharge portion and the insulating member, and in a state in which the space is being heated by a heating means.

The above object is further accomplished by a unique ball forming device of the present invention that is used in a wire bonding apparatus in which a discharge is caused to occur by applying a high voltage between an electric torch and a tip end of a wire that extends out of a lower end of a capillary so as to form a ball at a tip end of the wire; and in the present invention, the ball forming device is comprised of: an insulating member which covers the electric torch with a space formed between the vicinity of a discharge portion of the electric torch and the insulating member, and a heater provided on the insulating member so as to heat the space.

DETAILED DESCRIPTION OF THE INVENTION

Embodiments of the present invention will be described below with reference to the accompanying drawings.

Figure 1:
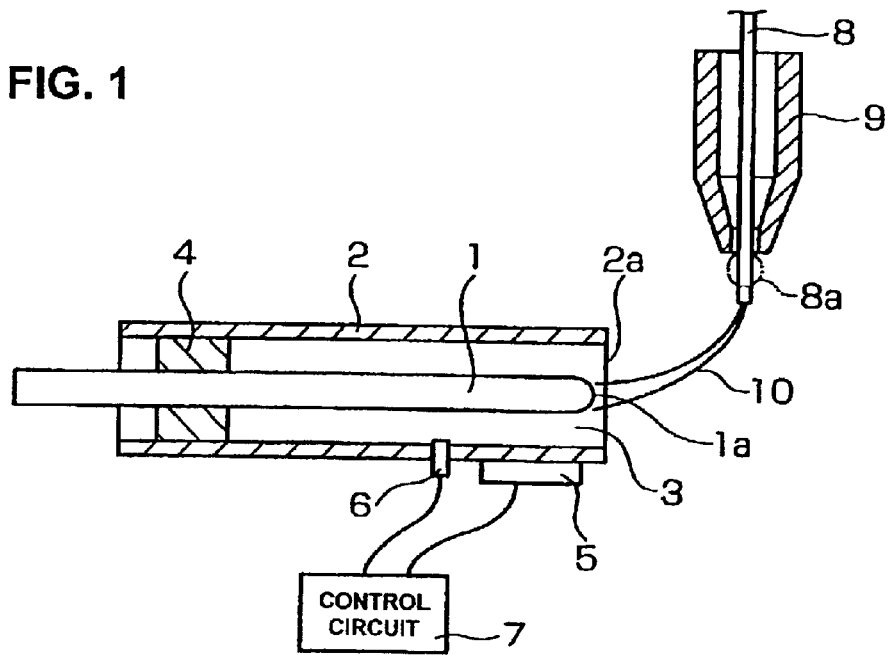
FIG. 1 shows, in cross-section, the first embodiment of the ball forming device according to the present invention that is used in a wire bonding apparatus.

In FIG. 1, an insulating member 2 made of an insulating material such as glass, etc. is disposed around the circumference of an electric torch 1 with a space 3 formed between the insulating member 2 and the electric torch 1. The insulating member 2 is fastened to the electric torch 1 with a fastening member 4 provided in between. A heater 5, which heats the area around the discharge portion 1a of the electric torch 1; and a temperature detector 6, which measures the temperature of the space 3, is attached to the insulating member 2. The heating temperature of the heater 5 is controlled by a control circuit 7 based upon the measurement results of the temperature detector 6.

A wire 8 is passed through a capillary 9, and this wire 8 extends out of the lower end of the capillary 9 at the time of ball formation. A positive electrode voltage is applied to the wire 8, and a negative electrode voltage is applied to the electric torch 1, so that a high-voltage discharge 10 occurs between these two elements. With the energy of this discharge 10, the tip end portion of the wire 8 is melted, and a ball 8a is formed.

In the above embodiment, the insulating member 2 is heated by the heater 5 during the formation of the ball 8a. As a result, the temperature of the space 3 and electric torch 1 rises; and with the temperature rise in the electric torch 1, free electrons on the surface of the electric torch 1 are activated, improving the capacity of the discharge conditions so that the discharge is facilitated. Furthermore, the temperature inside the insulating member 2 rises and is stabilized in a state that there is little moisture in the area around the discharge portion 1a of the electric torch 1. Consequently, the discharge of the electric torch 1 is stable, the atmosphere up to the tip end of the wire 8 is fixed, and a stable discharge 10 is accomplished even if the discharge distance is set to be long. Furthermore, since the electric torch 1 is provided inside the insulating member 2, the discharge is not affected by the outside air, the discharge density is therefore stabilized, and the balls having a constant diameter are formed.

Figure 2:
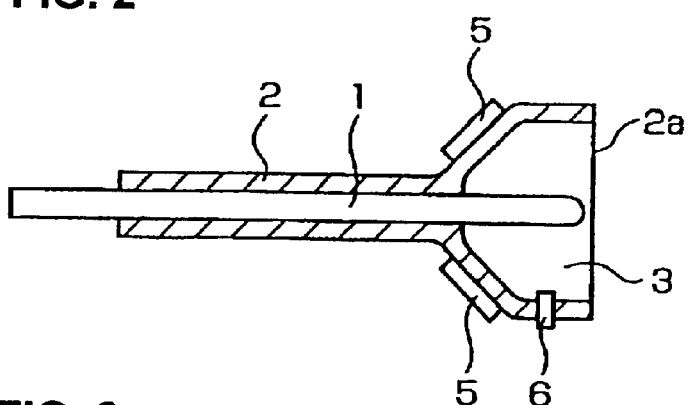
FIG. 2 shows, in cross-section, the second embodiment of the ball forming device according to the present invention that is used in a wire bonding apparatus.

FIG. 2 shows the second embodiment of the present invention. Components that are the same as those in FIG. 1 or that correspond to those in FIG. 1 are labeled with the same reference numerals, and a detailed description of such components is omitted.

In the second embodiment, the opening 2a of the insulating member 2 is formed so as to have a larger diameter than the rest of the insulating member 2, so that a broad space 3 is formed in the vicinity of the tip end portion of the electric torch 1. Effects substantially the same as those of the first embodiment are obtained by the second embodiment.

Figure 3:
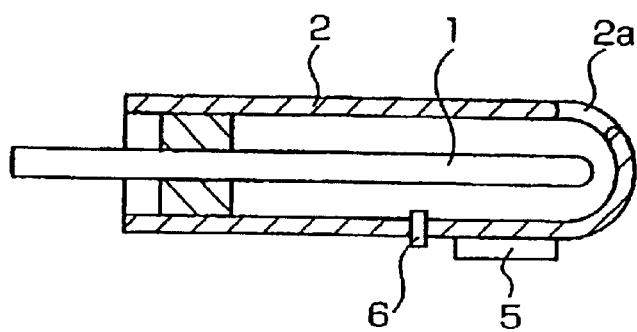
FIG. 3 shows, in cross-section, the third embodiment of the ball forming device according to the present invention that is used in a wire bonding apparatus.

FIG. 3 shows the third embodiment of the present invention.

In the first embodiment shown in FIG. 1, the opening 2a of the insulating member 2 is located on the front tip end of the electric torch 1. In the third embodiment, the opening 2a of the insulating member 2 is provided so as to be located above the tip end of the electric torch 1. This configuration is suitable in cases where a discharge is to be performed from the upper surface or upper end of the electric torch 1. Substantially the same effects as that of above-described embodiments are obtained by the third embodiment as well.

As seen from the above, in the present invention, the electric torch is covered by an insulating member with a space between insulating member and the discharge portion of the torch, and a discharge is performed while the area around the discharge portion is being heated. Accordingly, the free electrons on the surface of the electric torch are effectively activated, and the atmosphere around the electric torch can be stabilized. As a result, the discharge is stable, and balls having a constant diameter can be provided.

What is claimed is:

1. A ball formation method in a wire bonding apparatus in which a discharge is caused to occur by applying a high voltage between an electric torch and a tip end of a wire that extends out of a lower end of a capillary so as to form a ball at a tip end of said wire, wherein said discharge is performed in a state:

in which a discharge portion of said electric torch is covered by an insulating member with a space formed between said discharge portion and said insulating member, in which said tip end of said wire is located outside of said insulating member, and in which said space is being heated by a heating means provided on said insulating member.

2. A ball forming device used in a wire bonding apparatus in which a discharge is caused to occur by applying a high voltage between an electric torch and a tip end of a wire that extends out of a lower end of a capillary so as to form a ball at a tip end of said wire, wherein said ball forming device is comprised of:

an insulating member which covers said electric torch with a space formed between the vicinity of a discharge portion of said electric torch and said insulating member, and a heater provided on said insulating member so as to heat said space, and wherein a tip end of said wire is provided outside of said insulating member.

3. The ball forming device according to claim 2, wherein a temperature of said heater is controlled by a control circuit.

* * * * *